(12) United States Patent
Teo et al.

(10) Patent No.: US 10,658,501 B2
(45) Date of Patent: May 19, 2020

(54) VERTICALLY STACKED MULTICHANNEL PYRAMID TRANSISTOR

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/900,867

(22) Filed: Feb. 21, 2018

(65) Prior Publication Data

US 2019/0259866 A1    Aug. 22, 2019

(51) Int. Cl.
*H01L 29/778* (2006.01)
*H01L 29/78* (2006.01)
(Continued)

(52) U.S. Cl.
CPC ...... *H01L 29/7785* (2013.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS 9,793,353 B1    10/2017  Tsai
2011/0068371 A1*  3/2011  Oka ................. H01L 29/66462
                                                      257/194
(Continued)

FOREIGN PATENT DOCUMENTS

CN       105355657 A    11/2015
CN       106981513 A     4/2017

OTHER PUBLICATIONS

Liu et al., "Highly Linear Al0.3Ga0.7N-Al0.05Ga0.95N-GaN Composite Channel HEMT," IEEE Electron Device Letters, IEEE Service Center, NY, US. vol. 26, No. 3, Mar. 2005, pp. 145-147.
(Continued)

*Primary Examiner* — Davienne N Monbleau
*Assistant Examiner* — Scott R Wilson
(74) *Attorney, Agent, or Firm* — Gennadiy Vinokur; James McAleenan; Hironori Tsukamoto

(57) ABSTRACT

A high electron mobility transistor (HEMT) includes a channel semiconductor structure including a stack of layers arranged on top of each other in an order of magnitudes of the polarization of materials of the layers to form multiple carrier channels at heterojunctions formed by each pair of layers in the stack. The stack of layers includes a first layer and a second layer. The magnitude of polarization of the first layer is greater than the magnitude of polarization of the second layer arranged in the stack below the first layer, and the width of the first layer is less than the width of the second layer to form a staircase profile of the semiconductor structure. The HEMT includes a source semiconductor structure including a heavily doped semiconductor material, a drain semiconductor structure including the heavily doped semiconductor material. The HEMT includes a source, a drain, and a gate electrodes to modulate the conductivity of the carrier channels. The gate electrode has a staircase shape
(Continued)

having trends and risers tracking the staircase profile of the semiconductor structure.

8 Claims, 11 Drawing Sheets

(51) Int. Cl.
| | | |
|---|---|---|
| *H01L 21/28* | (2006.01) | |
| *H01L 21/02* | (2006.01) | |
| *H01L 21/285* | (2006.01) | |
| *H01L 21/306* | (2006.01) | |
| *H01L 23/66* | (2006.01) | |
| *H01L 29/20* | (2006.01) | |
| *H01L 29/205* | (2006.01) | |
| *H01L 29/66* | (2006.01) | |
| *H01L 29/10* | (2006.01) | |
| *H01L 29/06* | (2006.01) | |
| *H01L 29/08* | (2006.01) | |

(52) U.S. Cl.
CPC .. *H01L 21/02546* (2013.01); *H01L 21/02631* (2013.01); *H01L 21/28575* (2013.01); *H01L 21/30612* (2013.01); *H01L 23/66* (2013.01); *H01L 29/0657* (2013.01); *H01L 29/1037* (2013.01); *H01L 29/2003* (2013.01); *H01L 29/205* (2013.01); *H01L 29/40111* (2019.08); *H01L 29/66462* (2013.01); *H01L 29/7786* (2013.01); *H01L 29/78391* (2014.09); *H01L 29/0847* (2013.01)

(56) References Cited

U.S. PATENT DOCUMENTS

| | | | |
|---|---|---|---|
| 2014/0021488 A1* | 1/2014 | Lee | H01L 29/267 257/77 |
| 2014/0138747 A1* | 5/2014 | Lee | H01L 29/42316 257/194 |
| 2014/0264273 A1 | 9/2014 | Howell et al. | |
| 2015/0303292 A1* | 10/2015 | Shibata | H01L 29/42316 257/76 |
| 2016/0126340 A1 | 5/2016 | Nechay et al. | |
| 2016/0247905 A1 | 8/2016 | Ostermaier et al. | |
| 2017/0221667 A1 | 8/2017 | Hyde et al. | |
| 2017/0365719 A1* | 12/2017 | Chen | H01L 29/78391 |
| 2019/0043976 A1* | 2/2019 | Kotani | H01L 29/7783 |

OTHER PUBLICATIONS

Wikipedia: Hafnium(IV)-oxid.

* cited by examiner

| III-N Material | Spontaneous Polarization Charge (C/m^2) |
|---|---|
| GaN | -0.029 |
| AlN | -0.081 |
| InN | -0.032 |

$Al_x In_y Ga_z N = x \cdot (-0.081) + y \cdot (-0.032) + z \cdot (-0.029) \; [C/m^2]$ $wherein, x + y + z = 1$

FIG 1C

VERTICALLY STACKED MULTICHANNEL PYRAMID TRANSISTOR

TECHNICAL FIELD

The present invention relates generally to semiconductor device such as high electron mobility transistors for high frequency applications.

BACKGROUND

Materials such as silicon (Si) and gallium arsenide (GaAs) have found wide application in semiconductor devices. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2 DEG) is formed at the heterojunction of two semiconductor materials with different bandgap energies, and where the smaller bandgap material has a higher electron affinity. The 2 DEG is an accumulation layer in the undoped ("unintentionally doped"), smaller bandgap material and can contain a very high sheet electron concentration in excess of, for example, $10^{13}$ cm$^{-2}$. Additionally, electrons that originate in the wider-bandgap semiconductor transfer to the 2 DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. One of the most important performance metric for RF transistor is the linearity. A transistor with high linearity consumes lower power when used is Low Noise Amplifier (LNA) or Power Amplifier (PA). Therefore, it is desirable to design a transistor with high linearity and higher power density.

SUMMARY

Some embodiments are based on realization that the linearity of the transistor can be improved by reducing $g_{m3}$ value with respect to the voltage of the transistor. Specifically, the lower the magnitude to $g_{m3}$, the higher the linearity. Some embodiments are based on recognition that the value of $g_{m3}$ is close to zero around the threshold voltage. However, the region of the threshold voltage with close to zero value of $g_{m3}$ is typically very small making it almost impractical to operate the transistor in such a small gate voltage range.

Some embodiments are based on realization that a semiconductor device can be fabricated to have multiple carrier channels with different threshold voltages, while all the channels are operated by the same gate voltage. Moreover, the threshold voltages can be engineered in such a way that gm3 of one of such a channel destructively interferes with gm3 of another channel and cancels each other. Thus, the composite device having N− such vertically stacked channels is able to provide gm3 close to zero for a wide range of gate voltage. This phenomenon of destructive interference of gm3 is referred herein as "Derivative Superposition."

Some embodiments are based on another realization that the derivative superposition can be achieved by a channel semiconductor structure including a stack of layers arranged on top of each other in an order of magnitudes of the polarization of materials of the layers to form multiple carrier channels at heterojunctions formed by each pair of layers in the stack. For example, the stack of layers includes a first layer and a second layer arranged in the stack below the first layer. The magnitude of polarization of the first layer is selected to be greater than the magnitude of polarization of the second layer. In addition, the width of the first layer is selected to be less than the width of the second layer to form a staircase profile of the semiconductor structure.

In those embodiments, the width of each channel is varying and the threshold voltage for each of the channel is a function of the channel width. This means that this multichannel pyramid device has multiple channels vertically stacked on top of each other wherein each channel has different threshold voltage and all the channels are operated by the same gate voltage. The threshold voltages are engineered in such a way that $g_{m3}$ of one such channel destructively interferes with gm3 of another channel and cancels each other at least in part. Thus, the composite device having N− such vertically stacked channels is able to provide gm3 close to zero for a wider range of gate voltage using the derivative superposition.

Accordingly, one embodiment discloses a high electron mobility transistor (HEMT), including a channel semiconductor structure including a stack of layers arranged on top of each other in an order of magnitudes of the polarization of materials of the layers to form multiple carrier channels at heterojunctions formed by each pair of layers in the stack, wherein the stack of layers includes a first layer and a second layer, wherein a magnitude of polarization of the first layer is greater than a magnitude of polarization of the second layer arranged in the stack below the first layer, and wherein the width of the first layer is less than the width of the second layer to form a staircase profile of the channel semiconductor structure; a source semiconductor structure including a heavily doped semiconductor material, the source semiconductor structure is electrically connected to the channel semiconductor structure to provide carriers to all carrier channels; a drain semiconductor structure including the heavily doped semiconductor material, the drain semiconductor structure is electrically connected to the channel semiconductor structure to receive the carriers on all carrier channels; a source electrode arranged on the source semiconductor structure to make electrical contacts with each carrier channel; a drain electrode arranged on the drain semiconductor structure to make electrical contacts with each carrier channel; and a gate electrode arranged between the source electrode and the drain electrode along the length of the HEMT to modulate the conductivity of the carrier channels, wherein the gate electrode has a staircase shape having trends and risers tracking the staircase profile of the semiconductor structure.

Another embodiment discloses a method for manufacturing a high electron mobility transistor (HEMT), including providing a substrate and a channel semiconductor structure including a stack of layers arranged on top of each other in an order of magnitudes of the polarization of materials of the layers to form multiple carrier channels at heterojunctions formed by each pair of layers in the stack, wherein the stack of layers includes a first layer and a second layer, wherein a magnitude of polarization of the first layer is greater than a magnitude of polarization of the second layer arranged in the stack below the first layer, and wherein the width of the first layer is less than the width of the second layer to form a staircase profile of the semiconductor structure; etching the channel semiconductor structure to define an active region of the transistor; forming a source semiconductor structure including a heavily doped semiconductor material, the source semiconductor structure is electrically connected to the channel semiconductor structure to provide carriers to all carrier channels; forming a drain semiconductor structure including the heavily doped semiconductor material, the drain semiconductor structure is electrically connected to the channel semiconductor structure to receive the carriers on all carrier channels; forming a source electrode arranged on the source semiconductor structure to make electrical contacts with each carrier channel; forming a drain electrode arranged on the drain semiconductor structure to make electrical contacts with each carrier channel; and forming a gate electrode arranged between the source electrode and the drain electrode along the length of the HEMT to modulate the conductivity of the carrier channels, wherein the gate electrode has a staircase shape having trends and risers tracking the staircase profile of the semiconductor structure.

BRIEF DESCRIPTION OF THE DRAWINGS

FIG. 1C shows a table listing examples of values of spontaneous polarization for different III-N materials used by some embodiments for selection of epilayers and their relative arrangement.

DETAILED DESCRIPTION

Figure 1A:
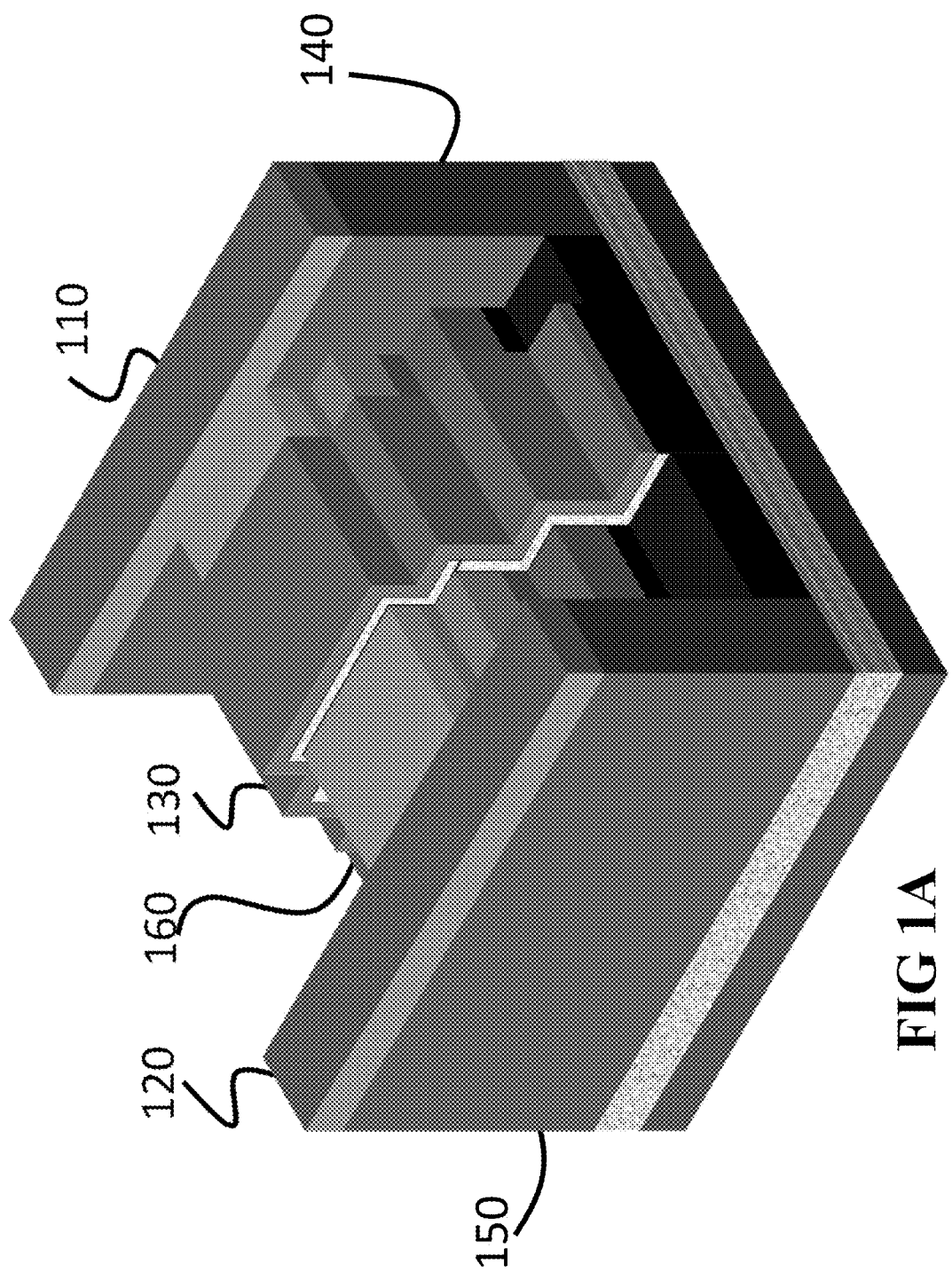
FIG. 1A shows the 3-Dimensional schematic of a semiconductor device according to one embodiment.

FIG. 1A shows the 3-D schematic of a semiconductor device according to one embodiment. The semiconductor device includes a source electrode 110, a drain electrode 120 and a gate electrode 130 for electrical connection to the external sources. The semiconductor region beneath the source electrode is called the source region 140, the semiconductor region beneath the drain electrode is called the drain region 150, and the semiconductor region beneath the gate electrode is called the channel region 160. Here the channel region includes multiple heterostructures so that they form multiple 2-DEG channels. To modulate the conductivity of these vertically stacked multiple channels with the same gate electrode a pyramid shaped structure is formed in the channel region which includes multiple trends and risers.

In such a manner, the semiconductor device of FIG. 1A is a high electron mobility transistor (HEMT). The channel region 160 HEMT is formed by a channel semiconductor structure including a stack of layers arranged on top of each other in an order of magnitudes of the polarization of materials of the layers to form multiple carrier channels at heterojunctions formed by each pair of layers in the stack. The source region 140 is formed by a source semiconductor structure including a heavily doped semiconductor material; the source semiconductor structure is electrically connected to the channel semiconductor structure to provide carriers to all carrier channels. Similarly, the drain region 150 is formed by a drain semiconductor structure including the heavily doped semiconductor material; the drain semiconductor structure is electrically connected to the channel semiconductor structure to receive the carriers on all carrier channels.

In the HEMT of FIG. 1A, the source electrode 110 is arranged on the source semiconductor structure 140 to make electrical contacts with each carrier channel, and the drain electrode 120 is arranged on the drain semiconductor structure to make electrical contacts with each carrier channel. The gate electrode 130 is arranged between the source electrode and the drain electrode along the length of the HEMT to modulate the conductivity of the carrier channels.

In various embodiments, the channel semiconductor structure includes a stack of layers of different widths forming a staircase profile of the channel semiconductor structure. To that end, the gate electrode 130 also has a staircase shape having trends and risers tracking the staircase profile of the channel semiconductor structure.

Figure 1B:
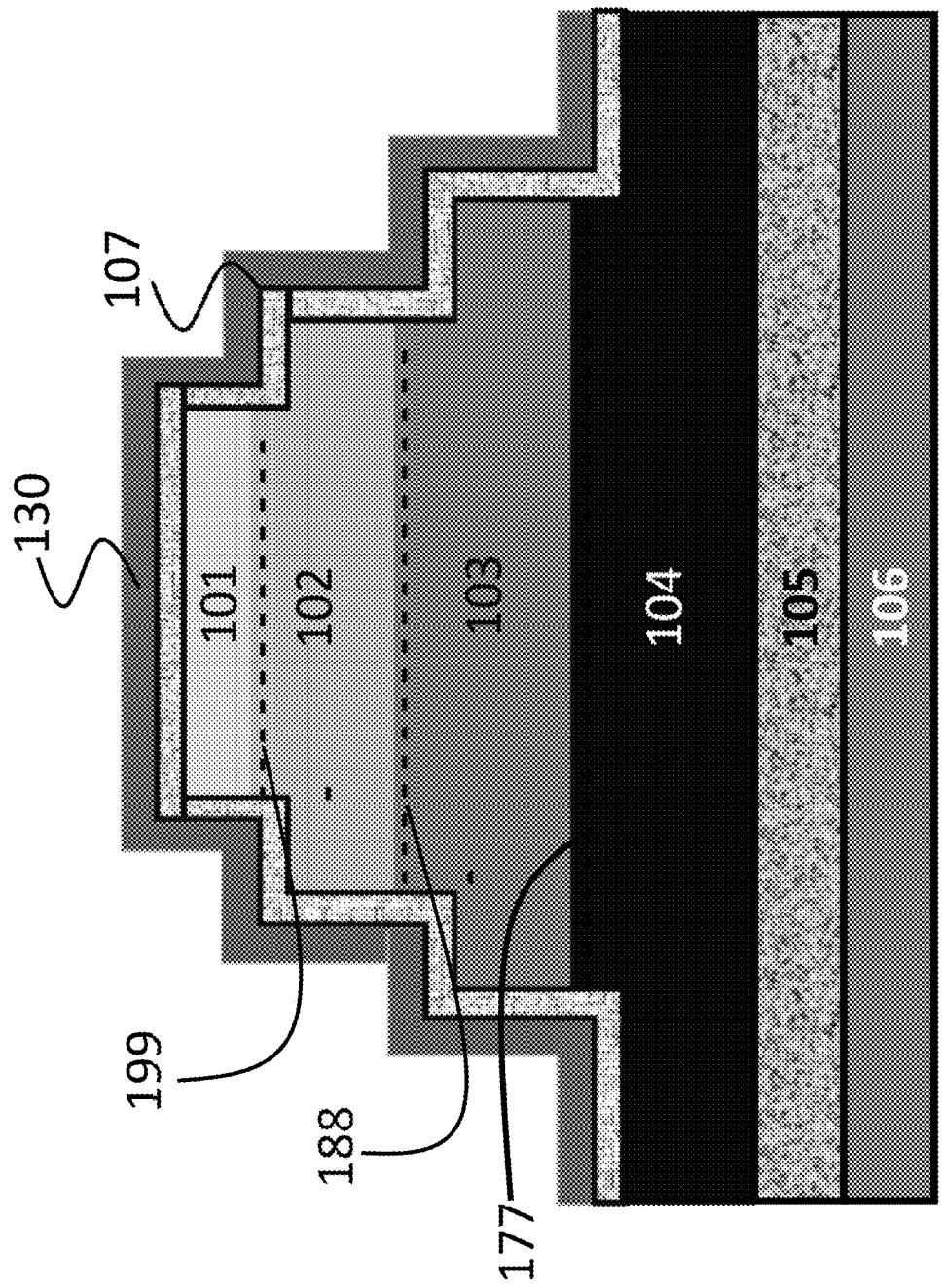
FIG. 1B shows the cross section view in the middle of the channel along the width of the device according to some embodiment.

FIG. 1B shows the cross section of the channel region formed by a channel semiconductor structure of the semiconductor device according to one embodiment. In different implementations, the channel semiconductor structure includes the stack of layers, e.g., a first layer and a second layer arranged in the stack below the first layer. The magnitude of polarization of the first layer is greater than a magnitude of polarization of the second layer, and the width of the first layer is less than the width of the second layer to form a staircase profile of the semiconductor structure.

In this example, the channel region includes three heterostructures; $1^{st}$ one formed between layers 101 and 102, $2^{nd}$ one formed between layers 102 and 103 and the third one formed between layers 103 and 104. Each heterostructure interface forms 2-DEG (2-Dimensional Electron Gas) channels 199, 188 and 177. Different embodiments can have N 2-DEG channels with N+1 different III-N layers. In different embodiments, all of the III-N layers satisfy a condition that magnitude of the spontaneous polarization of a layer is higher than the magnitude of the polarization of the layer beneath it.

FIG. 1C shows a table 190 listing examples of values of spontaneous polarization for different III-N materials used by some embodiments for selection of epilayers and their relative arrangement. For example, typically, polarization of Ga-Face III-N material is negative. When two III-N materials of different spontaneous polarization are grown on top of each other, depending on the absolute value of the spontaneous polarization charge either 2-DEG (2-Dimensional Electron Gas) or 2-DHG (2-Dimensional Hole Gas) channel is form at the interface. If the III-N material grown on top has higher absolute value of spontaneous polarization than the material underneath it then a 2-DEG will form, if the situation is reversed then 2DHG will form instead. The polarization of a tertiary semiconductor can be found by the Vegard's law 191.

In some embodiments, the width of each channel is varying and the threshold voltage for each of the channel is a function of the channel width. This means that the HEMT according to some embodiments has multiple channels vertically stacked on top of each other wherein each channel has different threshold voltage and all the channels are operated by the same gate voltage. The threshold voltage of a particular carrier channel depends on the 2-DEG concentration in the channel (normally increasing carrier concentration moves the threshold voltage to the far negative domain) and the fin width of the channel (decreasing fin-width moves the threshold voltage towards positive domain).

The exemplar device of FIGS. 1A and 1B includes three 2-DEG channels labeled 177, 188 and 199. The width of each of this channel is different thus contributing to the variation of threshold voltage used by some embodiments to improve the linearity of the transistor. As has been mentioned before, each of the III-N layer is selected in such a way that the layer on top has higher absolute value of polarization than the layer beneath it. Such a selection makes sure that 2-DEG channels 177, 188 and 199 have different carrier concentrations. The variation of 2-DEG carrier concentration also contribute to the threshold voltage variation. Therefore, from circuit point of view the transistor structure drawn in FIGS. 1A and 1B can be thought of as a parallel combination of three different transistors each having different threshold voltage but being operated by the same gate voltage.

Figure 1D:
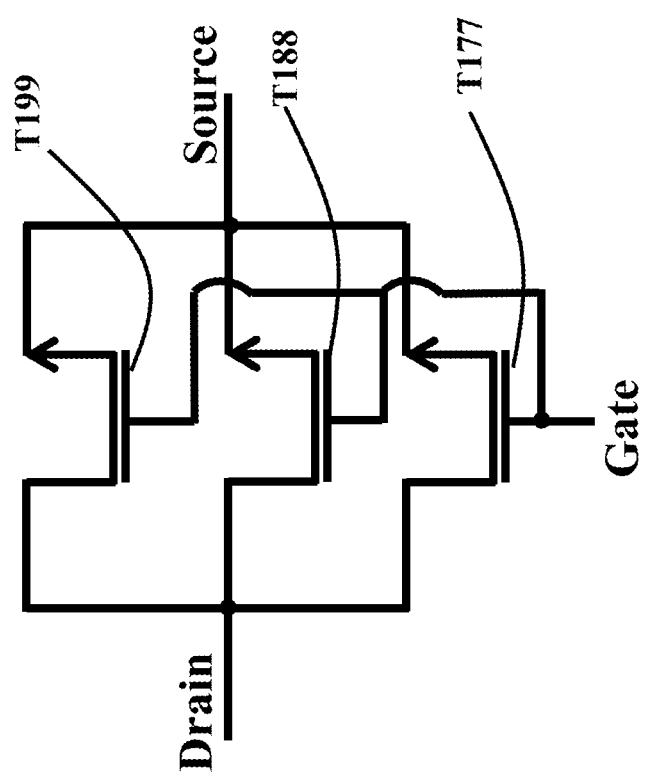
FIG. 1D shows a circuit connection that mimics the action of the semiconductor device according to one embodiment.

FIG. 1D shows such a circuit connection wherein transistors T177, T188 and T199 represent the transistor formed by 2-DEG carrier channels 177, 188 and 199 respectively.

The threshold voltages are engineered in such a way that $g_{m3}$ of one such channel destructively interferes with gm3 of another channel and cancels each other. Thus, the composite device having N– such vertically stacked channels is able to provide gm3 close to zero for a very wide range of gate voltage. This phenomenon of destructive interference of gm3 is referred herein as "Derivative Superposition".

In some implementations the material of the channel semiconductor structure includes one or combination of gallium nitride (GaN), indium gallium nitride (InGaN), gallium arsenide (GaAs), indium gallium arsenide (InGaAs), aluminum gallium nitride (AlGaN), indium gallium nitride (InGaN), aluminum nitride (AlN), aluminum gallium arsenide (AlGaAs), aluminum arsenide (AlAs), and indium aluminum gallium arsenide (InAlGaAs). Additionally, or alternatively, the source and the drain semiconductor region includes one or combination of gallium nitride (GaN), indium gallium nitride (InGaN), gallium arsenide (GaAs), indium gallium arsenide (InGaAs).

In some implementations, the semiconductor device includes a layer of dielectric 107 arranged in between the gate electrode 130 and the channel semiconductor structure forming the channel region 160. In one embodiment, the materials of region 107 can include but is not limited to silicon di-oxide (SiO2), silicon nitride (SixNy), silicon oxide nitride hydrogen ($Si_xO_yN_zH_w$), aluminum oxide (Al2O3), hafnium oxide (HfO2). The dielectric region layer 107 can be formed as a passivation layer. Additionally, or alternatively, in some implementations, the semiconductor device includes a buffer layer 105 and a substrate 106 to provide mechanical stability to the semiconductor device.

Figure 2A:
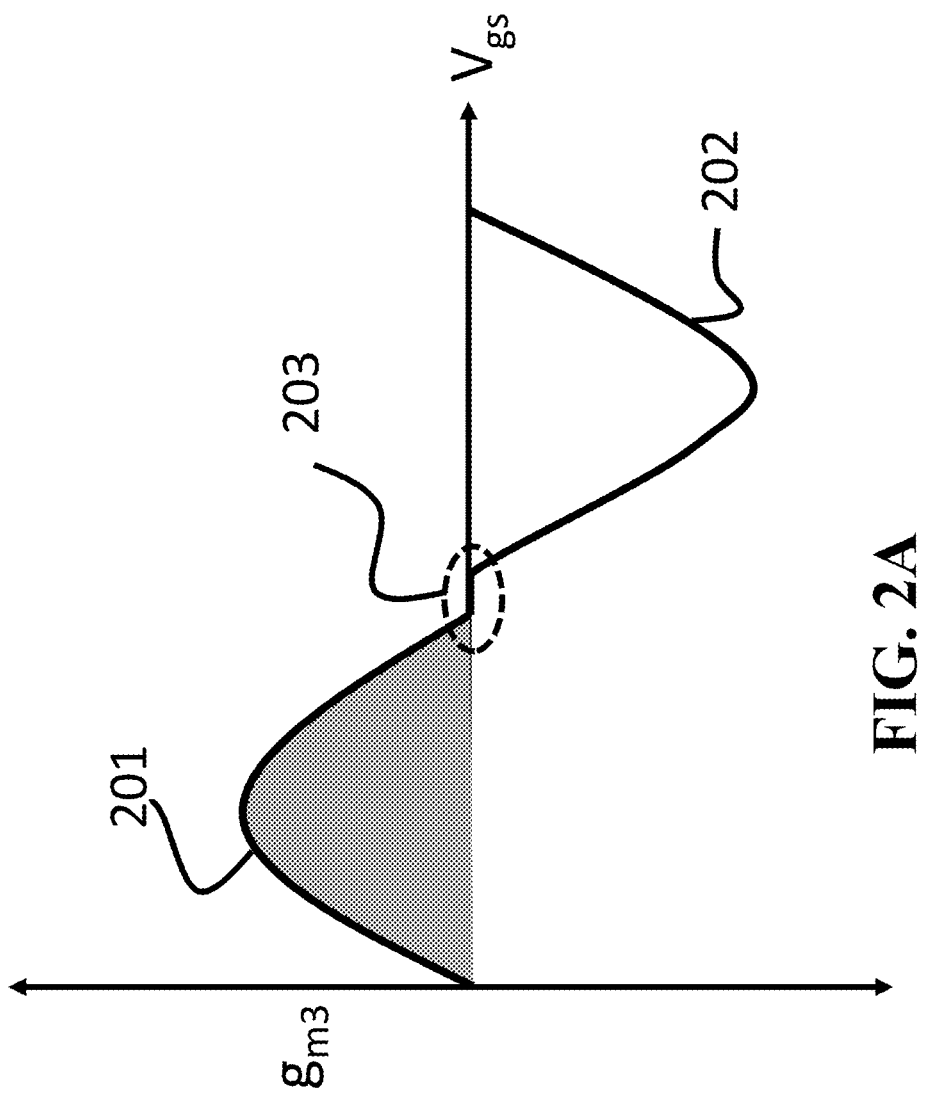
FIGS. 2A and 2B show plots illustrating how multiple channels having different fin widths according to some embodiments improves the linearity of a semiconductor device according to some embodiment.
Figure 2B:
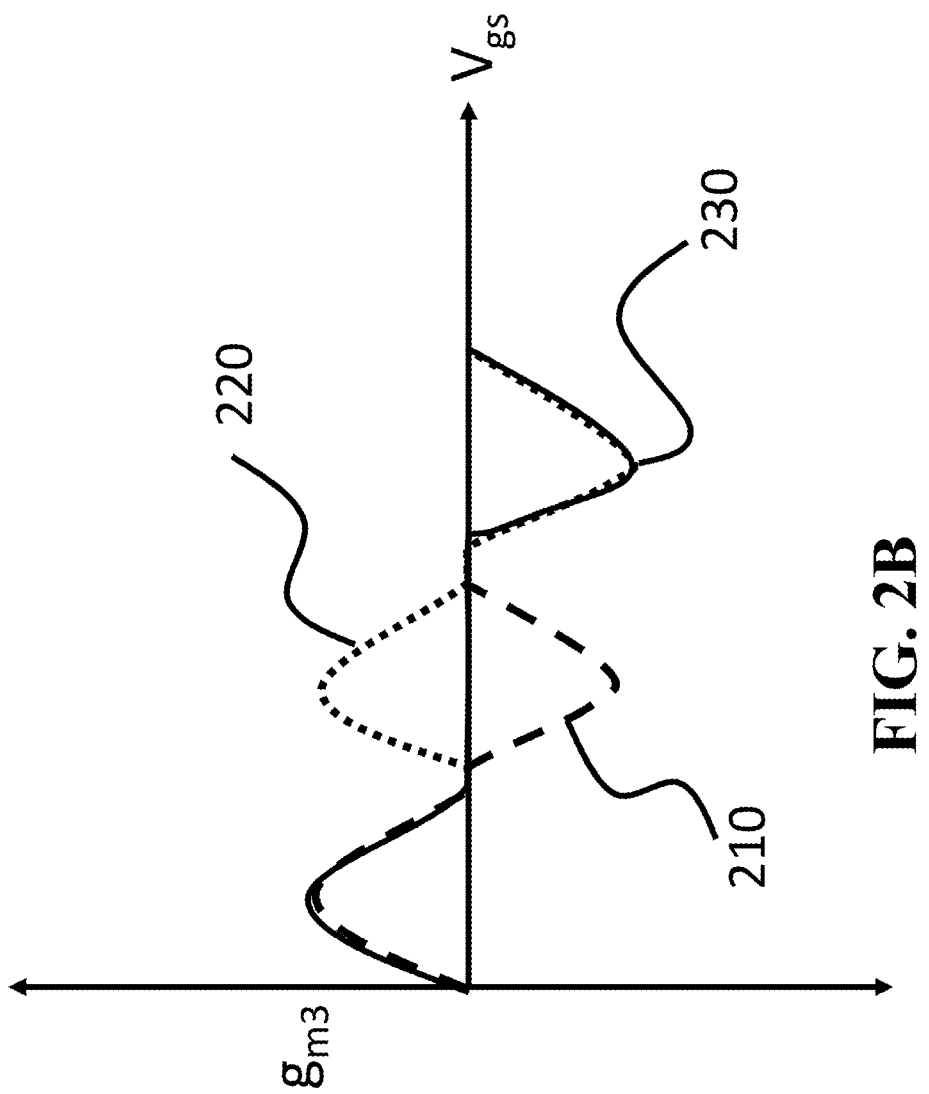

FIGS. 2A and 2B show plots illustrating how a vertically stacked multi-channel HEMT having pyramid shape in the channel region improves the linearity of a semiconductor device. $g_{m3}$ which is defined mathematically by the following expression $$g_{m3} = \frac{d^3 I_{DS}}{dV_{GS}^3},$$

is the hall mark of linearity of any transistor. The lower the magnitude to $g_{m3}$, the higher the linearity.

FIG. 2A shows a plot of $g_{m3}$ vs $V_{gs}$ gate voltage of a transistor. Things to be noticed in this curve is that any $g_{m3}$ curve would have one positive region (shaded) labeled 201 and one negative region (not-shaded) labeled 202. The transition from positive to negative region happens around the threshold voltage. The region labelled 203 in this figure is the ideal region for operation since it has gm3 value close to zero. However, the problem is the extension of this region along the $V_{gs}$ axis is very small making it almost impractical to operate the transistor in such a small gate voltage range.

FIG. 2B shows the $g_{m3}$ vs $V_{gs}$ plots 210 and 220 for two vertically stacked channels 199 and 188 shown respectively in FIG. 1B. Here, the threshold voltages (which is a function of the width of each channel) of the channels are designed is such a way that negative region of gm3 curve of 199 channel overlaps with the positive region of gm3 curve of 188 channel Therefore, a transistor that has only these two vertically stacked channels would have a gm3 curve like the one labeled 230. One thing to be noticed is that the gate voltage region over which gm3 value is zero or close to zero has been enhanced. This kind of destructive interference of gm3 is termed as "Derivative Superposition."

Figure 3:
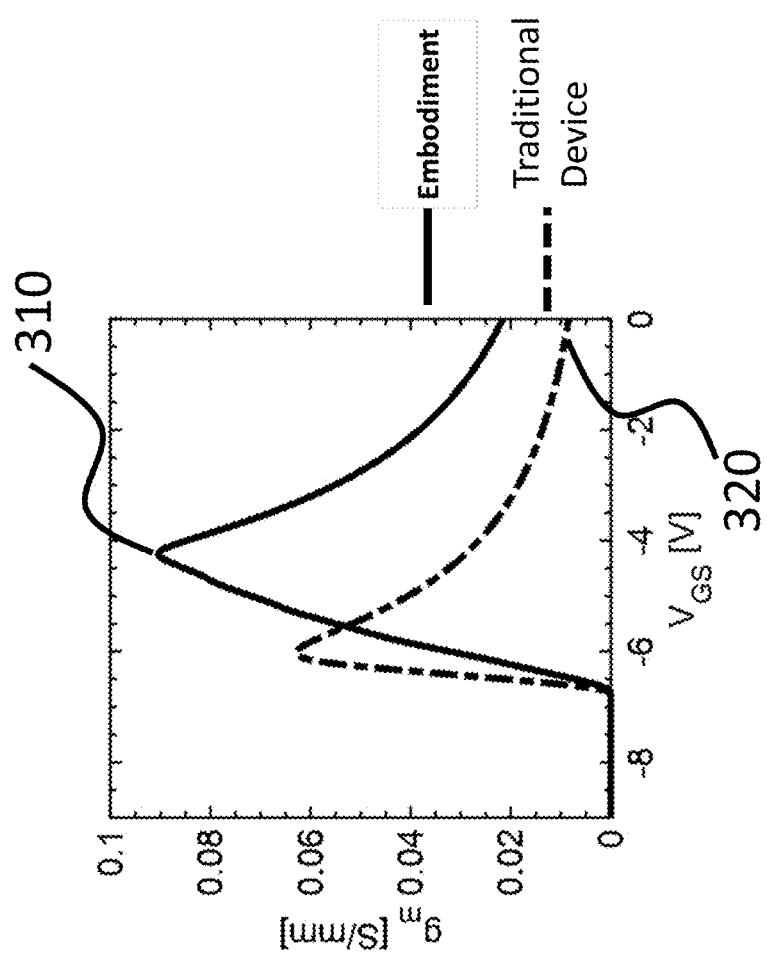
FIG. 3 shows $g_m$ vs $V_{gs}$ curve for a HEMT with single channel and a $g_m$ vs $V_{gs}$ curve for proposed pyramid transistor according to some embodiments.

FIG. 3 shows the $g_m$ vs $V_{gs}$ curve for a conventional single channel HEMT (labelled 320) and for a HEMT with vertically stacked multi-channel having pyramid shape to facilitate different threshold voltage for each of the 2-DEG channel (labelled 310), according to some embodiments. Some embodiments are based on recognition that the linearity of a transistor depends on the rise of transconductance with respect to the gate voltage. A gradual increase of transconductance yields high linearity whereas a rapid increase of transconductance results in low linearity. As shown in this figure, the transconductance 310 of the transistor employing principles of some embodiments rises slowly compared to the transconductance. In this example, only three different channels have been used. However, more vertically stacked channels yield even higher linearity. In addition, the peak gin of the device of some embodiments has a higher value than the peak gin of a conventional HEMT which can be attributed to its multiple channels.

Figure 4:
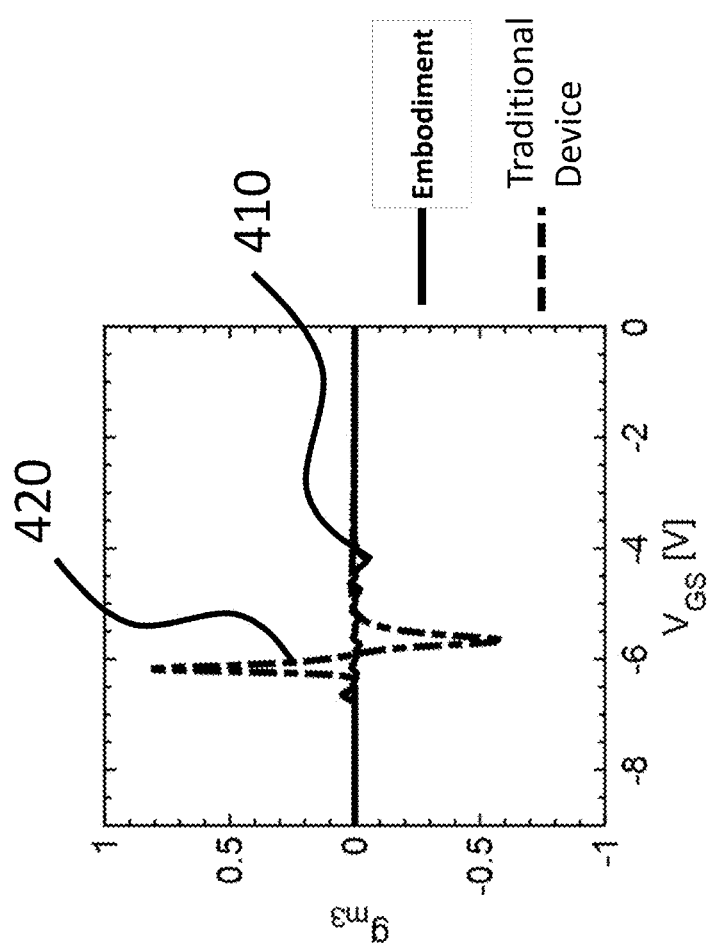
FIG. 4 shows $g_{m3}$ vs $V_{gs}$ characteristics for a HEMT with single channel and a $g_{m3}$ vs $V_{gs}$ curve for proposed pyramid transistor according to some embodiments.

FIG. 4 shows a plot of gm3 vs $V_{gs}$ characteristics 410 of a transistor according to some embodiments along with gm3 vs $V_{gs}$ characteristics 420 of a conventional HEMT. As mentioned earlier gm3 is the indicator of the linearity of a device—a higher linearity refers to the lower gm3. An ideal linear transistor should have gm3 very close to zero. From this example, it is quite evident that gm3 of the transistor according to some embodiments is less than the gm3 of conventional HEMT.

Figure 5:
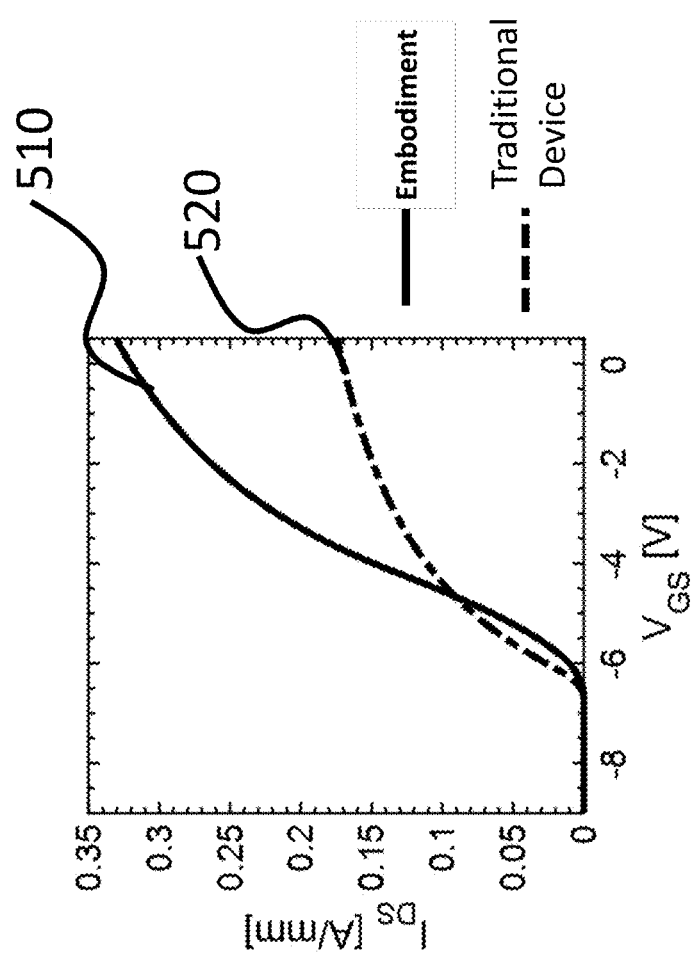
FIG. 5 shows $I_{DS}$ vs $V_{gs}$ characteristics for a HEMT with single channel and a $I_{DS}$ vs $V_{gs}$ curve for proposed pyramid transistor according to some embodiments.

FIG. 5 shows a plot of $I_{DS}$ vs $V_{gs}$ characteristics 510 of a transistor according to some embodiments along with $I_{DS}$ vs $V_{gs}$ characteristics 520 of a conventional HEMT. Two distinctive features of 510 should be noticed here are as follows, (i) at lower gate voltage drain current in 510 rises slowly compared to 520 giving rise to higher linearity in transistor performance as discussed earlier (ii) the peak drain current value is higher in 510 than 520, this is because of the multiple channels being operated by the same applied voltage. The device of some embodiments can be thought of a composite transistor which has multiple transistors connected in parallel at the source and the drain terminals and their gate terminals are tied together.

Figure 6:
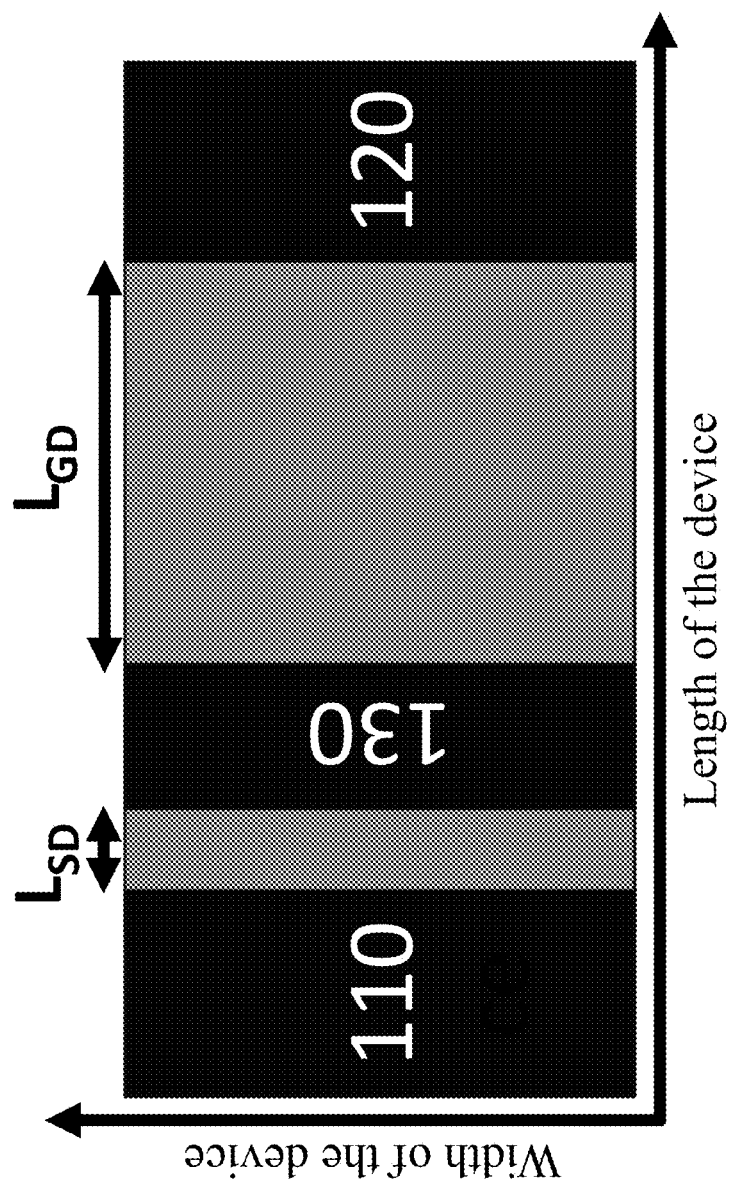
FIG. 6 shows the relative arrangement of Source, Gate and Drain electrodes of HEMT according to one embodiment.

FIG. 6 shows the top view of a device according to one embodiment exhibiting the relative arrangement of source, gate and drain electrodes. In this embodiment, the distance between the source and the gate $L_{SD}$ is lower than the distance between the Gate and the Drain $L_{GD}$. In some implementations, $L_{SD}$ is as low as possible because high $L_{SD}$ increases source resistance which in turn decreases the linearity of the device. However, $L_{SD}$ cannot be made very small as it increases the parasitic capacitances which decreases cut off frequency. For most applications $L_{SD}$ is smaller than 500 nm. $L_{GD}$ depends on the break down voltage of the device. Higher break down voltage needs higher $L_{GD}$. $L_{GD}$ also depends on the material property of the semiconductor that would be used to form the channel, a wide band gap material would give higher breakdown voltage at a relatively lower $L_{GD}$. For example if the breakdown voltage of the device is $V_{BR}$ then a GaN based device $$L_{GD} = \frac{V_{BR}}{100\,\text{V}}\ \mu\text{m}.$$

The break-down voltage of any RF transistor has a direct relation with the maximum RF output power, $$P_{OUT} \sim \frac{1}{8} I_{DS\cdot\max}(V_{BR} - V_{knee})^2.$$

Therefore, a high breakdown voltage gives higher output power.

Figure 7:
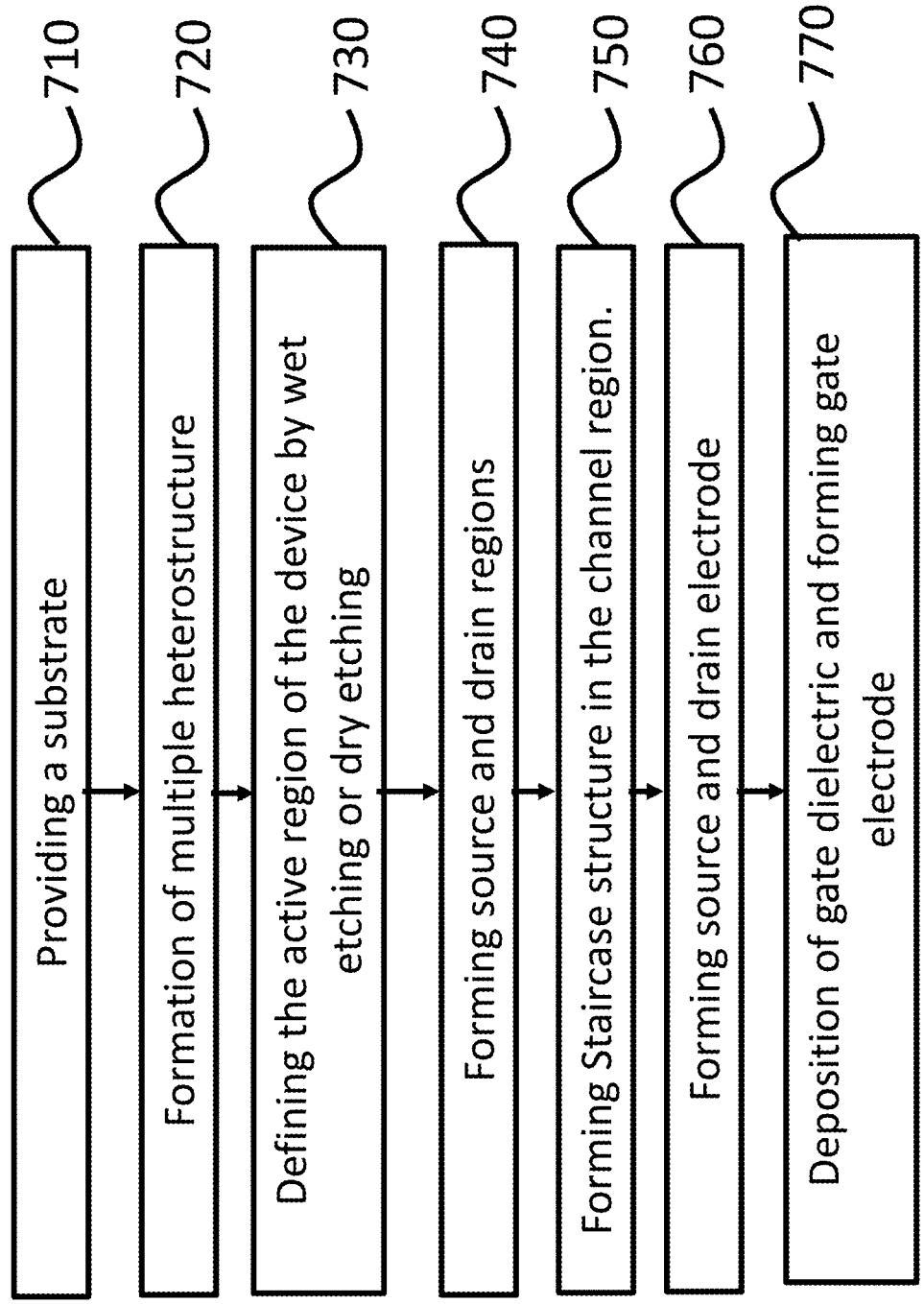
FIG. 7 shows the block diagram of a method for fabricating a semiconductor device according to some embodiments.

FIG. 7 shows the block diagram of a method for fabricating a semiconductor device according to some embodiments. The method includes providing substrate 710 and making 720 a semiconductor structure comprising at least two heterostructures. The material of the heterostructure is selected, in such a way, that there forms a 2-DEG channel at the interface of each of the heterostructures. According to some embodiments, various methods can be adopted for the growth and formation of these heterostructure semiconductor layers, including but not limited to a Chemical Vapor Deposition (CVD), a Metal-Organic-Chemical-Vapor-Deposition (MOCVD), a Molecular Beam Epitaxy (MBE), a Metal-Organic Vapor Phase Epitaxy (MOVPE) and a Plasma Enhanced Chemical Vapor Deposition (PECVD) and a microwave plasma deposition system.

The method then includes, defining the active region of the transistor by wet etching or dry etching 730.

The method further includes 740, the formation of source and drain semiconductor region which can be done the by selectively etching the heterostructures from the source and drain region and then selective deposition of appropriate semiconductors in the source and drain region.

Further method also includes 750, the formation of pyramid structure in the channel region, which can be done by one or combination of dry and wet etching method.

Further the method also includes 760, formation of source and the drain electrode to electrically connect to the carrier channel using one or combination of an ebeam deposition, a joule evaporation, a chemical vapor deposition and a sputtering process. Then the sample is annealed >800° C. in vacuum or N2 environment to form the ohmic contact.

Further method also includes 770, deposition of gate dielectric to electrically isolate the gate metal form the channel region which reduces the gate leakage and improve the RF performance of the transistor. Then the gate metal deposition is done, by using one or combination of Lithography→Metal Deposition→Lift-off and Metal deposition→Lithography→Etching.

Here the lithography could be performed using, including but not limited to photo-lithography, electron-beam lithography. Metal deposition can be done using one or combination of an ebeam deposition, a joule evaporation, a chemical vapor deposition and a sputtering process.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

We claim:

1. A high electron mobility transistor (HEMT), comprising:
    a channel semiconductor structure including a stack of layers arranged on top of each other in an order of magnitudes of the polarization of materials of the layers to form multiple carrier channels at heterojunctions formed by each pair of layers in the stack, wherein the stack of layers includes a first layer and a second layer, wherein a magnitude of polarization of the first layer is greater than a magnitude of polarization of the second layer arranged in the stack below the first layer, and wherein the width of the first layer is less than the width of the second layer to form a staircase profile of the channel semiconductor structure;
    a source semiconductor structure including a heavily doped semiconductor material, the source semiconductor structure is electrically connected to the channel semiconductor structure to provide carriers to all carrier channels;
    a drain semiconductor structure including the heavily doped semiconductor material, the drain semiconductor structure is electrically connected to the channel semiconductor structure to receive the carriers on all carrier channels; and a source electrode arranged on the source semiconductor structure to make electrical contacts with each carrier channel;

a drain electrode arranged on the drain semiconductor structure to make electrical contacts with each carrier channel; and a gate electrode arranged between the source electrode and the drain electrode along the length of the HEMT to modulate the conductivity of the carrier channels, wherein the gate electrode has a staircase shape having trends and risers tracking the staircase profile of the semiconductor structure, wherein the risers have different heights.

2. The HEMT of claim 1, further comprising:

a layer of dielectric arranged in between the gate electrode and the channel semiconductor structure.

3. The HEMT of claim 2, wherein the dielectric layer between the gate electrode and the channel semiconductor layer is a ferroelectric oxide giving rise to negative capacitance behavior when a voltage is applied at the gate electrode.

4. The HEMT of claim 1, wherein the trends have identical widths.

5. The HEMT of claim 1, wherein the trends have different widths.

6. The HEMT of claim 1, wherein a distance between the source electrode and the gate electrode is greater than a distance between the gate electrode and the drain electrode.

7. The HEMT of claim 1, wherein the material of the channel semiconductor structure includes one or combination of gallium nitride (GaN), indium gallium nitride (InGaN), gallium arsenide (GaAs), indium gallium arsenide (InGaAs), aluminum gallium nitride (AlGaN), indium gallium nitride (InGaN), aluminum nitride (AlN), aluminum gallium arsenide (AlGaAs), aluminum arsenide (AlAs), and indium aluminum gallium arsenide (InAlGaAs).

8. The HEMT of claim 1, wherein the source and the drain semiconductor region includes one or combination of gallium nitride (GaN), indium gallium nitride (InGaN), gallium arsenide (GaAs), indium gallium arsenide (InGaAs).

* * * * *